(12) United States Patent
Naidu et al.

(10) Patent No.: US 12,360,149 B2
(45) Date of Patent: Jul. 15, 2025

(54) MACHINE LEARNING BASED METHOD AND DEVICE FOR DISTURBANCE CLASSIFICATION IN A POWER TRANSMISSION LINE

(71) Applicant: Hitachi Energy Ltd, Zürich (CH)

(72) Inventors: Obbalareddi Demudu Naidu, Karnataka (IN); Dinesh Patil, Karnataka (IN); Preetham Venkat Yalla, Karnataka (IN)

(73) Assignee: HITACHI ENERGY LTD, Zürich (CH)

( * ) Notice: Subject to any disclaimer, the term of this patent is extended or adjusted under 35 U.S.C. 154(b) by 389 days.

(21) Appl. No.: 17/777,883

(22) PCT Filed: Nov. 18, 2020

(86) PCT No.: PCT/EP2020/082577
§ 371 (c)(1),
(2) Date: May 18, 2022

(87) PCT Pub. No.: WO2021/099413
PCT Pub. Date: May 27, 2021

(65) Prior Publication Data
US 2022/0413032 A1  Dec. 29, 2022

(30) Foreign Application Priority Data

Nov. 19, 2019 (IN) .............................. 201941047094

(51) Int. Cl.
*G01R 31/08* (2020.01)
*G01R 19/25* (2006.01)
(Continued)

(52) U.S. Cl.
CPC ....... *G01R 31/088* (2013.01); *G01R 19/2513* (2013.01); *G06N 20/00* (2019.01); *H02H 1/0092* (2013.01); *H02H 7/226* (2013.01)

(58) Field of Classification Search
CPC .. G01R 19/2513; G01R 31/08; G01R 31/088; G06N 20/00; H02H 1/0092; H02H 3/44; H02H 7/226; Y02E 60/00
See application file for complete search history.

(56) References Cited

U.S. PATENT DOCUMENTS 5,726,847 A    3/1998  Dalstein
8,131,401 B2   3/2012  Nasle
(Continued)

FOREIGN PATENT DOCUMENTS

CN    105445613 A      3/2016
EP    0783197 A1  *   7/1997  ............... H02H 1/04
(Continued)

*Primary Examiner* — Yoshihisa Ishizuka
(74) *Attorney, Agent, or Firm* — Procopio, Cory, Hargreaves & Savitch LLP

(57) ABSTRACT

The present specification provides a method and device for determining a disturbance condition in a power transmission line. The method may include obtaining a plurality of sample values corresponding to an electrical parameter measured in each phase. The method may further include determining a plurality of magnitudes of the electrical parameter corresponding to each phase based on the corresponding plurality of sample values and determining a plurality of difference values for each phase based on the corresponding plurality of magnitudes. The method may include processing the plurality of difference values using a machine learning technique to determine the disturbance condition. The disturbance condition may be one of a load change condition, a power swing condition, or an electrical fault condition. The method may also include performing at
(Continued)

least one of a protection function or a control function based on the disturbance condition.

22 Claims, 9 Drawing Sheets

(51) Int. Cl.
    *G06N 20/00*     (2019.01)
    *H02H 1/00*     (2006.01)
    *H02H 7/22*     (2006.01)

(56) References Cited

U.S. PATENT DOCUMENTS

| | | |
|---|---|---|
| 9,217,775 B2 | 12/2015 | Mousavi et al. |
| 2009/0319093 A1* | 12/2009 | Joos ................. H02J 3/144 |
| | | 700/297 |
| 2016/0084919 A1* | 3/2016 | Gokaraju ............ H02P 9/102 |
| | | 702/182 |
| 2018/0302420 A1 | 10/2018 | Nakanelua et al. |
| 2019/0199081 A1* | 6/2019 | Ayeb ................... H02H 3/08 |
| 2019/0286724 A1* | 9/2019 | Kudo .................. G06N 20/10 |
| 2019/0318011 A1* | 10/2019 | Teran Guajardo .... G06F 16/906 |

FOREIGN PATENT DOCUMENTS

| | | |
|---|---|---|
| JP | H07147725 A | 6/1995 |
| JP | 2016-152674 A | 8/2016 |
| WO | 2014/094977 A1 | 6/2014 |

* cited by examiner

MACHINE LEARNING BASED METHOD AND DEVICE FOR DISTURBANCE CLASSIFICATION IN A POWER TRANSMISSION LINE

CROSS-REFERENCE TO RELATED APPLICATIONS

The present application is a national stage entry of International Patent Application No. PCT/EP2020/082577, filed on Nov. 18, 2020, which claims priority to Indian Patent Application number 201941047094, filed on Nov. 19, 2019, which are both hereby incorporated herein by reference as if set forth in full.

BACKGROUND

Embodiments of the present specification relate generally to disturbance detection, and more particularly to machine learning techniques for detection and classification of disturbance conditions in a power transmission line.

Power transmission systems experience various electrical disturbances such as electrical faults, power swings, and load changes due to various intrinsic or extrinsic factors. For example, power swings can occur when a group of power generators accelerate relative to each other and electrical faults occur when electrical parameters change from their nominal values to affect equipment and cause disruption in normal operations. Load changes occur when electrical parameters typically refer to variations in electrical parameters at one point in an electrical system due to change of load across supply output.

Infrastructure equipment and consumer devices are to be protected during disturbance conditions that are generated due to various operating conditions. For example, during a fault condition, a part of the grid may need to be disconnected by a protection relay. However, some power swing conditions in the absence of fault conditions are also capable of operating a protection relay causing a blackout. Power swings are a major reason for many of blackouts around the world. Regardless of the cause, once a system has a blackout it often takes several hours to restore the power system. This has a huge economic impact on utilities and consumers and must be prevented in a modern grid. Reliable determination of fault condition and other disturbance conditions is very important for distance relay application to prevent the maloperation and blackout during a power swing condition.

Conventionally, blinders (or concentric characteristics) were used to differentiate normal faults from power swings. Alternatively, other techniques such as, but not limited to, swing center voltage (SCV) technique, resistance technique and superimposed current and voltage signal technique are employed to detect and differentiate fault disturbances. However, these techniques pare not effective for disturbances near swing center points or in three phase transmission lines. Additional blinders are used around system line angle to detect disturbances near swing center point. Such methods require complex system specific settings as well as better quality of phasor estimates.

Recent integration of renewable sources in the power system architecture has imposed newer demands on power handling and fault tolerant capabilities of the power systems. The fluctuations in power change the grid inertia, source to line impedance ratios (SIRs) and swing frequency. These conditions demand elaborate procedures requiring large computations. There is a need to develop a novel disturbance detection scheme for future low inertia power systems.

BRIEF DESCRIPTION

In accordance with one aspect of the present specification, a method for determining a disturbance condition in a power transmission line is disclosed. The method is performed by an Intelligent Electronic Device (IED) communicatively coupled with a measurement equipment connected with the power transmission line. The method includes obtaining a plurality of sample values corresponding to an electrical parameter measured in each phase among one or more phases. The electrical parameter in the one or more phases is measured with the measurement equipment connected at one end (single end) of the power transmission line. The method further includes determining a plurality of magnitudes of the electrical parameter (such as root mean square (RMS) values) corresponding to each phase based on the corresponding plurality of sample values. The method also includes determining a plurality of difference values for each phase based on the corresponding plurality of magnitudes (such as RMS values). Each of the plurality of difference values is representative of a rate of change of magnitude (such as RMS value) of the electrical parameter for the corresponding phase. The method includes processing the plurality of difference values corresponding to the one or more phases using a machine learning technique to determine the disturbance condition in the power transmission line. The disturbance condition is one of a load change condition, a power swing condition and an electrical fault condition. The method also includes performing at least one of a protection function and a control function based on the disturbance condition.

In accordance with another aspect of the present specification, an Intelligent Electronic Device (IED) for determining a disturbance condition in a power transmission line is disclosed. The IED is communicatively coupled with a measurement equipment connected with the power transmission line. The IED includes a data acquisition unit communicatively coupled to the measurement equipment connected at one end (single end) of a power transmission line and configured to obtain a plurality of sample values corresponding to an electrical parameter in each phase among the one or more phases measured by the measurement equipment. The IED further includes a signal processing unit communicatively coupled to the data acquisition unit and configured to determine a plurality of magnitudes of the electrical parameter (such as root mean square (RMS) values) corresponding to each phase among the one or more phases based the plurality of sample values. The signal processing unit is further configured to determine a plurality of difference values for each phase among the one or more phases based on the corresponding plurality of magnitudes (such as RMS values). Each of the plurality of difference values is representative of rate of change of magnitude (such as RMS value) of the electrical parameter of the corresponding phase. The IED further includes a machine learning unit communicatively coupled to the signal processing unit and configured to process the plurality of difference values corresponding to the one or more phases using a machine learning technique to determine the disturbance condition in the power transmission line. The disturbance condition is one of a load change condition, a power swing condition and a fault condition. The IED also includes a control unit communicatively coupled to the machine learning unit and configured to perform at least one of a protection function and a control function based on the disturbance condition.

DRAWINGS

These and other features and aspects of embodiments of the present invention will be better understood when the following detailed description is read with reference to the accompanying drawings in which like characters represent like parts throughout the drawings, wherein.

DETAILED DESCRIPTION

As will be described in detail hereinafter, an Intelligent Electronic Device (IED) having ability to determine disturbance condition in a power transmission line and corresponding method of disturbance determination are presented. More particularly disclosed embodiments are related to a machine learning technique for determining a disturbance condition in the power transmission line.

The term 'phase' and the phrase 'phase signal' are used equivalently and interchangeably in the present specification. Similarly, the phrases 'transmission line' and 'power transmission line' are used herein equivalently and interchangeably. The phrase 'sample value' refers to a real numbered value representative of an electrical parameter and is obtained from sampling the electrical parameter. The electrical parameter may refer to, in a non-limiting sense, a voltage signal and/or a current signal. The sample value corresponds to a time instant of the electrical parameter. The phrase 'root mean square value' refers specifically to square root of an average of sample values with reference to a time window. However, embodiments of the present specification may also employ a sample energy value or a sample power value corresponding to the plurality of sample values in the time window. The term 'smoothing' refers to low pass filtering of sample values within a time window. The phrase 'difference signal' refers to a discrete signal with a plurality of difference values. In one embodiment, the phrase 'difference value' refers to a difference between two successive root mean square values. The phrase 'ensemble learning' refers to a class of machine learning techniques where a plurality of learning models is employed in multiple stages. The phrase 'boosting' has been used equivalently and interchangeably with 'boost'. The phrase 'residual model' refers to one of the plurality of learning models trained to reduce the modeling error progressively in successive stages. The residual model is trained based on a residual error from a previous stage. The residual error refers to difference between predictions and the ground truth of the present stage. A 'protection action' performed by an Intelligent Electronic Device (IED) includes a blocking of the IED from operating and thereby providing immunity to a power swing condition. Similarly, a 'control action' performed by the IED includes an unblocking of the protection relay allowing it to operate and thereby ensuring protection from a fault.

Figure 1:
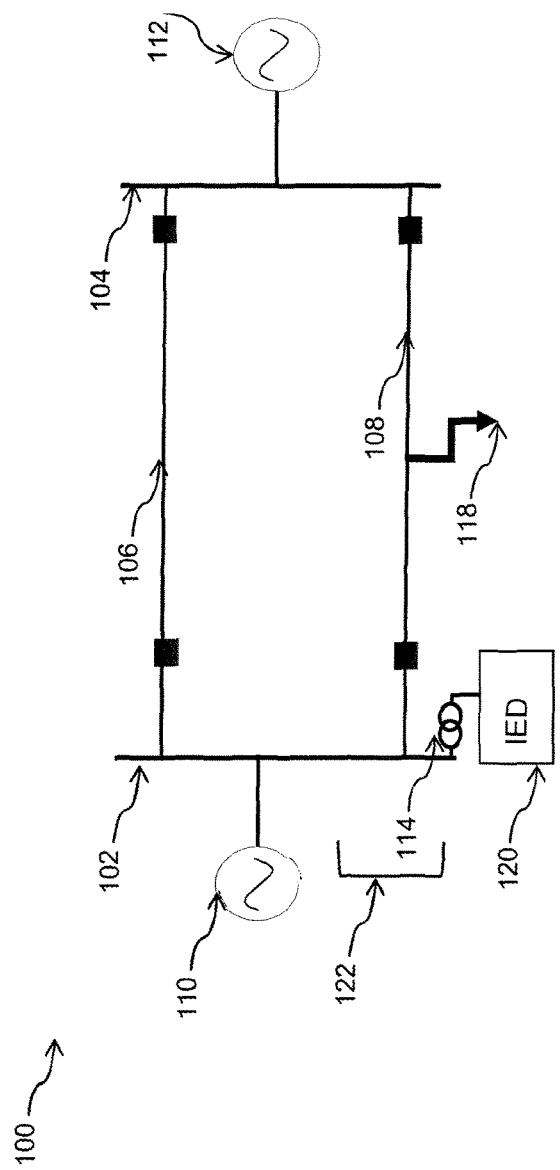
FIG. 1 is a diagrammatic illustration of a power transmission system having an Intelligent Electronic Device (IED) in accordance with an exemplary embodiment.

FIG. 1 is a diagrammatic illustration of a power transmission system 100 having a plurality of Intelligent Electronic Devices (IEDs) such as an IED 120 in accordance with an exemplary embodiment. The power transmission system 100 includes a first transmission line 106 and a second transmission line 108 connected between a first bus 102 and a second bus 104. Further, the first bus 102 is coupled to a first power source 110 and the second bus 104 is coupled to a second power source 112. It may be noted that in some embodiments of the system 100, the second bus 104 may be coupled to a load and in such embodiments, the numeral 112 represents the load. In the illustrated embodiment, a disturbance condition 118 is shown with the second transmission line 108. However, a disturbance condition in the first transmission line may also be managed by the same technique disclosed herein, with the IED associated with the corresponding line.

It may be noted herein that the disturbance condition 118 may be one of, but not limited to, a load change, a power swing, and a fault in at least one phase of the power transmission system. The power transmission system 100 includes measurement equipment 122 at at least one end of the transmission line. In the illustrated embodiment, measurement equipment 122 is disposed near the first bus 102. The measurement equipment 122 may include a voltage transformer 114, or other suitable voltage sensor, and is configured to measure a voltage signal. In an alternative embodiment, the measurement equipment 122 may be disposed at the second bus 104. In one embodiment, when the measurement equipment 122 is equipped with computational resources, the measurement equipment 122 may be configured to perform sampling of the voltage signal and generate a plurality of sample values. In a three phase electrical system, a plurality of sample values corresponding to each phase among the three phases is generated by the measurement equipment 122. The IED 120 is coupled to the measurement equipment 122 and configured to receive the plurality of sample values corresponding to one or more phases and determine a type of the disturbance in the power transmission system 100. In one embodiment, the plurality of samples corresponds to a plurality of voltage samples obtained from one or more phase voltage signals. While in the embodiment of FIG. 1, the measurement equipment 114 shown is a voltage transformer, the method disclosed herein works with other electrical parameters such as currents, power etc.

Figure 2:
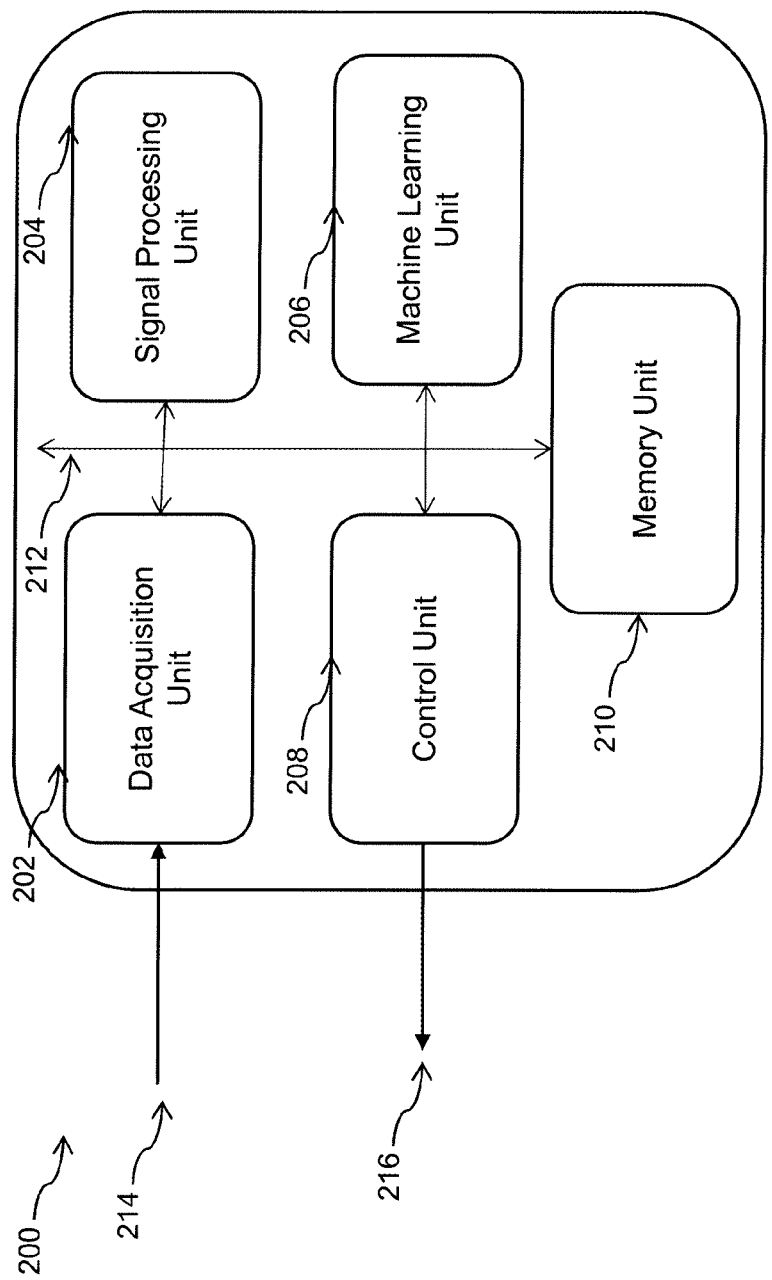
FIG. 2 is an illustration of the IED configured to perform disturbance detection in accordance with aspects of the present specification.

FIG. 2 is an illustration of an IED 200 configured to perform disturbance determination in accordance with aspects of the present specification. It may be noted that the IED 200 corresponds to IED 120 of FIG. 1. The IED can refer to a power system device configured to perform one or more of measurement, protection and control functions. As an example, the IED may be a protection relay configured to protect the line in the event of electrical disturbances or faults. In one embodiment, the IED 200 includes a data acquisition unit 202, a signal processing unit 204, a machine learning unit 206, a control unit 208 and a memory unit 210 communicatively coupled with each other via a communications bus 212.

The data acquisition unit 202 is communicatively coupled to a transmission line 214 via the measurement equipment and configured to receive a plurality of sample values corresponding to measurements in one or more phases among a plurality of phases of a transmission line 214. In one embodiment, the data acquisition unit 202 is configured to acquire analog signals from the measurement equipment 122 and configured to perform sampling of the voltage signal and generate a plurality of sample values. In a three phase transmission line, sample values from at least one of the plurality of phases may be obtained by the data acquisition unit 202. The data acquisition unit 202 includes circuitry to receive sample values from the measurement equipment (reference numeral 122 in FIG. 1). In an alternative embodiment, the data acquisition unit 202 may include sampling and digitization circuitry as well to convert an analog voltage signal sensed by a voltage sensor in the measurement equipment to convert to sample values. The data acquisition unit 202 may also be configured to perform signal conditioning and pre-processing of the received sample values. In a non-limiting example, the signal conditioning and pre-processing operations may include a normalization operation, a noise reduction operation and a bandwidth limiting operation. In yet another embodiment, the data acquisition unit 202 receives the sampled values of the measured signals from the measurement equipment (e.g. 122) or other measurement units that are communicatively coupled to such measurement equipment.

The signal processing unit 204 is communicatively coupled to the data acquisition unit 202 and configured to determine a plurality of difference values required by the machine learning unit 206 for determining disturbance condition. Specifically, in one embodiment, the signal processing unit 204 is configured to generate a plurality of values indicative of a magnitude of the measured electrical quantity, which may be root mean square values (RMS), based on the plurality of sample values for each phase among the one or more phases. Each of the plurality of RMS values is given for example by, $$V_{rms}(k) = \sqrt{\frac{1}{N} \sum_{l=k}^{k-N+1} V_p(l)^2}$$

where, $V_{rms}(k)$ is RMS value having a sample index of k calculated using N sample values $V_p(l)$ corresponding to a phase indexed by p.

While the magnitude of the measured electrical quantity may be determined as RMS value, other metrics that quantify the magnitude (or amplitude) of the measured electrical parameter in the respective one of the phases may be used. It may be noted herein that in alternate embodiments, sample energy values or sample power values may be determined instead of RMS values. In one embodiment, the sample energy value is determined as sum of squared sample values and the sample power value is determined as an average of sum of squared sample values. Specifically, in one example, when the supply voltage is fifty hertz, each phase is sampled at one kilo Hertz sampling rate and twenty samples are considered for computing RMS values. In another example, same number of samples may be considered when each phase of a supply voltage having sixty hertz of frequency is sampled at 1200 Hertz sampling rate. Alternatively, seventeen samples are considered for computing the RMS values when a sixty Hertz supply voltage is sampled at one kilo Hertz sampling rate. Further, a new RMS value is determined when every new sample value is available to the signal processing unit 204. When twenty samples are considered for computing an RMS value, the new RMS value in each phase is determined by considering previous nineteen sample values of the corresponding phase along with the new sample value. In one embodiment, a smoothed version of the plurality of root mean square values corresponding to each of the plurality of phases is determined by filtering the corresponding root mean square values. The signal processing unit 204 uses a low pass filter to perform smoothing of the plurality of RMS values in each of the plurality of phases.

The plurality of difference values computed by the signal processing unit 204 is representative of rate of change of the corresponding to each of the plurality of phases based on the plurality of RMS values. In one embodiment, the signal processing unit 204 is configured to generate a difference signal having a plurality of difference values corresponding to the plurality of RMS values in each phase. Each of the difference value is determined as a difference between two successive RMS values. The difference value is given by:

$$\Delta V_{rms}(k) = V_{rms}(k) - V_{rms}(k-1)$$

where, $\Delta V_{rms}$ is difference value, $V_{rms}(k)$ and $V_{rms}(k-1)$ are successive values of RMS values. In alternate embodiments, the difference value may be generated as a second order difference (i.e., a difference between a first RMS value and a third RMS value) or as a higher order difference (i.e., a difference between a first RMS value and a subsequent RMS value without considering a plurality of RMS values in between) when higher sampling frequencies are chosen.

The signal processing unit 204 is further configured to detect a disturbance condition based on the difference values. In one embodiment, each of the difference value is compared with a pre-determined threshold value and a disturbance is detected based on the outcome of the comparison. Specifically, when the difference value is greater than the pre-determined threshold, a disturbance condition is detected. In another embodiment, the difference value in each of the phase is compared with the pre-determined threshold and when difference value corresponding to any of the plurality of phases is greater than the pre-determined threshold, a disturbance condition is detected.

After detecting the disturbance condition, a type of disturbance is to be determined. For this purpose, a plurality of difference values corresponding to the disturbance condition is selected by the signal processing unit 204. Specifically, in one embodiment, the signal processing unit 204 is configured to select first three difference values in each phase immediately after the detection of the disturbance condition. In alternate embodiments, a different number of difference values may be selected in one or more phases after the detection of the disturbance condition. Further, the signal processing unit 204 is configured to transfer the selected difference values to the machine learning unit 206.

The machine learning unit 206 is communicatively coupled to the signal processing unit 204 and configured to process the difference values received from the signal processing unit 204. The difference values received from the signal processing unit 204 may correspond to one or more phases. In accordance with some embodiments, the machine learning unit 206 is configured to process the plurality of difference values corresponding to the plurality of phases using an ensemble machine learning technique to determine a type of disturbance condition. In other embodiments, the machine learning unit 206 may also use other machine learning techniques for processing the plurality of difference values. The type of disturbance condition includes one of a load change condition, a power swing condition and a transmission line fault condition. The ensemble machine learning technique may include one of a plurality of techniques such as, but not limited to, one of a bagging class of techniques or one of a boosting class of techniques.

Specifically, the boosting class of techniques may include one of an adaptive boosting technique or a gradient boosting technique. In an embodiment, a fast version of the gradient boost technique referred herein as 'extreme gradient boost technique' is used to determine the disturbance condition. In one embodiment, a machine learning model required to determine the disturbing condition is computed apriori via an offline activity e.g. through Monte Carlo simulations.

In one embodiment, Monte Carlo simulations are performed to train a gradient boost learning model using a plurality of labeled datasets. Each dataset in the plurality of labeled datasets include a phase signal, and a corresponding disturbance condition as an output category. Each dataset may also include corresponding set of three difference values. In a specific example, few hundreds of labeled datasets for each of the output categories are used for training the gradient boost learning model. Suitable parameters for the gradient boost learning model are selected for satisfactory performance. The parameters of the gradient boost learning model includes, but not limited to, number of residual models, objective parameter, and evaluation metric.

The control unit 208 is communicatively coupled to the machine learning unit 206 and configured to perform at least one of a protection function and a control function based on the disturbance condition. In one embodiment, when the machine learning unit determines a fault condition, a protection function is initiated. In such a scenario, the control unit 208 is configured to unblock a protection function and allowing the IED to isolate the transmission line from the fault. In another embodiment, when the machine learning unit 206 determines a power swing condition, the control unit 208 is configured to block the IED as one of a control action. In this embodiment, the IED cannot operate and the power swing condition is not isolated from the grid. Suitable actions can be taken according to the disturbance condition. For illustration, information may be output in dependence on the determined disturbance condition and/or a control action may be automatically triggered in dependence on the determined disturbance condition. The control action may be selected based on the determined disturbance condition.

Figure 3:
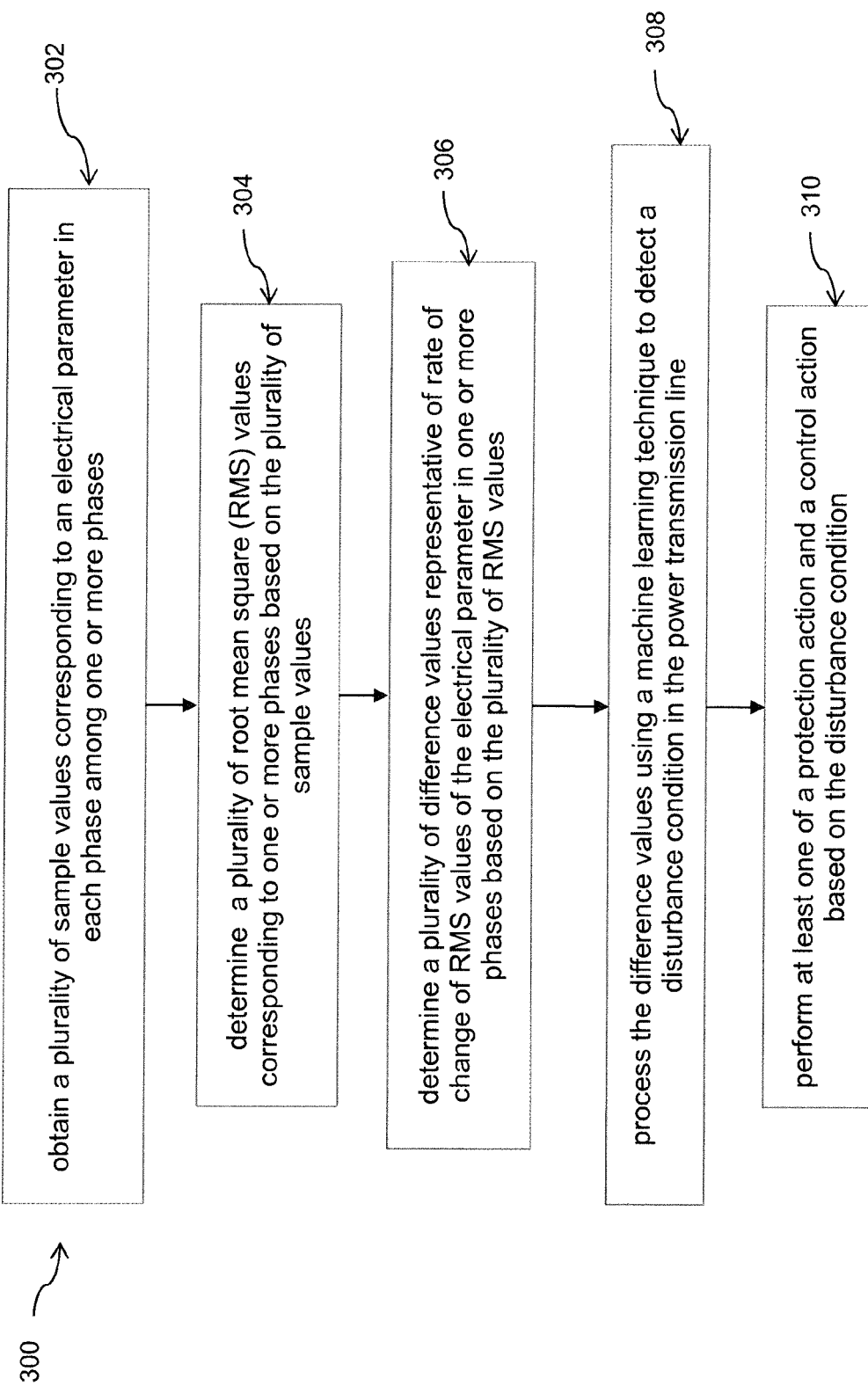
FIG. 3 is a flow chart illustrating a method for disturbance detection in a power transmission line in accordance with an exemplary embodiment.

FIG. 3 is a flow chart of a method 300 for disturbance determination in accordance with an exemplary embodiment. The method 300 is for determining a disturbance condition in a transmission line and performing a protection action or a control action based on the determined disturbance condition. Example protection actions include, but not limited to, operating a switching device (e.g. circuit breaker) using the IED during an extreme power swing due to a fault condition. The control action may include blocking operation of a switching device using the IED during a self restoring power swing conditions or unblocking operation of the switching device during the fault conditions.

The method 300 includes obtaining a plurality of sample values corresponding to one or more phases among a plurality of phases of the power transmission line as illustrated at step 302. The step of obtaining 302 includes measuring voltage signals in one or more phases of a transmission system at a location of interest by a measurement equipment. In the present embodiment, the measurement equipment includes one or more voltage sensors such as a voltage transformer. The voltage signals are sampled and converted to a plurality of sample values by either the measurement equipment, a dedicated measurement unit communicatively coupled to the measurement equipment, or by a data acquisition unit of the IED In one example, the power transmission system is a three-phase system and three voltage signals corresponding to the three phase transmission lines are measured by the measurement equipment. Further, the plurality of voltage signals are sampled at a 1 kHz sampling rate to generate a plurality of sample values corresponding to each of the plurality of phases. Although, the step 302 is explained here with reference to voltage signals, the plurality of sample values may also correspond to any other electrical parameter other than the voltage parameter. Specifically, the plurality of sample values may correspond to current signals in one or more phases of the transmission system, or a combination of current and voltage signals.

At step 304, the method also includes determining a plurality of values indicative of a magnitude of the measured electrical quantity, which may be root mean square (RMS) values, corresponding to each of the plurality of phases based on the plurality of samples. In one embodiment, each of the plurality of RMS values is determined based on a plurality of samples (sample values) corresponding to each of the phases. In some embodiments disclosed herein, about twenty sample values are considered in each phase to compute one RMS value in the corresponding phase. In one embodiment, a smoothed version of a plurality of root mean square values corresponding to one of the phase is considered for processing by subsequent steps of the method 300. A suitable low pass filter may be used to perform smoothing operation on the plurality of RMS values. While the magnitude of the measured electrical quantity may be determined as RMS value, other metrics that quantify the magnitude (or amplitude) of the measured electrical parameter in the respective one of the phases may be used.

The method 300 further includes determining a plurality of difference values representative of rate of change of the magnitudes (e.g., RMS values) of the electrical parameter measured from each of the plurality of phase signals at step 306. The plurality of difference values is determined based on the plurality of RMS values. In one embodiment, a difference value is derived as a difference between two successive magnitudes (e.g., RMS values). In an alternative embodiment, the difference value may be determined as a difference between non-adjacent magnitudes (e.g., RMS values). The method 300 also includes processing the difference values corresponding to the plurality of phases using a machine learning technique to determine the disturbance condition of the power transmission line as illustrated in step 308. The difference values utilized at the step can be the difference values linked with the disturbance (or disturbance condition). As mentioned above, the disturbance condition can be detected by comparing each difference value with a pre-determined threshold value. Further the difference values utilized to determine the type of the disturbance condition can be some specific values (two, three difference values etc.) together or excluding the difference value linked with the disturbance condition.

The machine learning technique utilized for the processing can be an ensemble machine learning technique. The ensemble machine learning technique includes, but not limited to, an adaptive boosting technique and a gradient boosting technique. As stated before, the disturbance condition includes one of a load change condition, a power swing condition and a transmission line fault condition. The method 300 also includes performing at least one of a control action or a protection action based on the disturbance condition. Specifically, in one embodiment, the action performed by the IED includes operating a switching device connected to the transmission line based on the disturbance condition at step 310 to block or unblock the IED The at least one control action or protection action may be performed automatically.

Figure 4A:
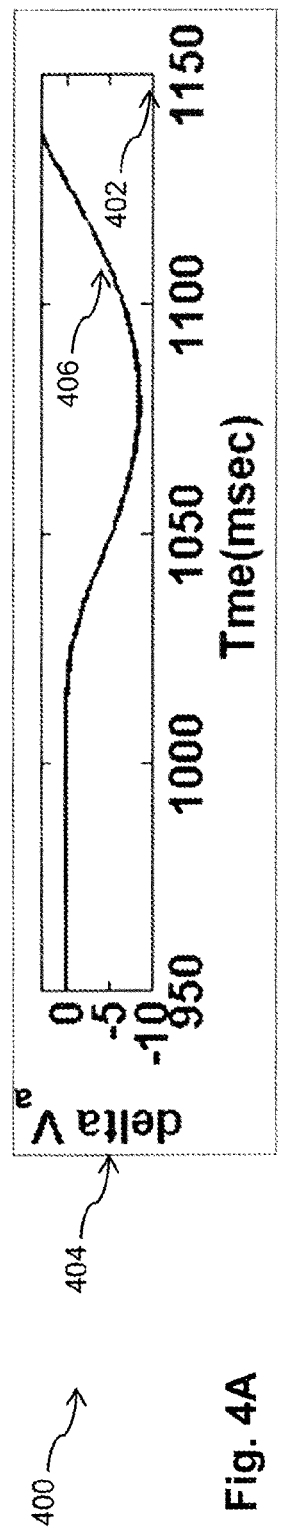
FIGS. 4A-4C are graphs illustrating a phase signal corresponding to a load change condition, a power swing condition and a power fault condition in accordance with embodiments of the present specification.
Figure 4B:
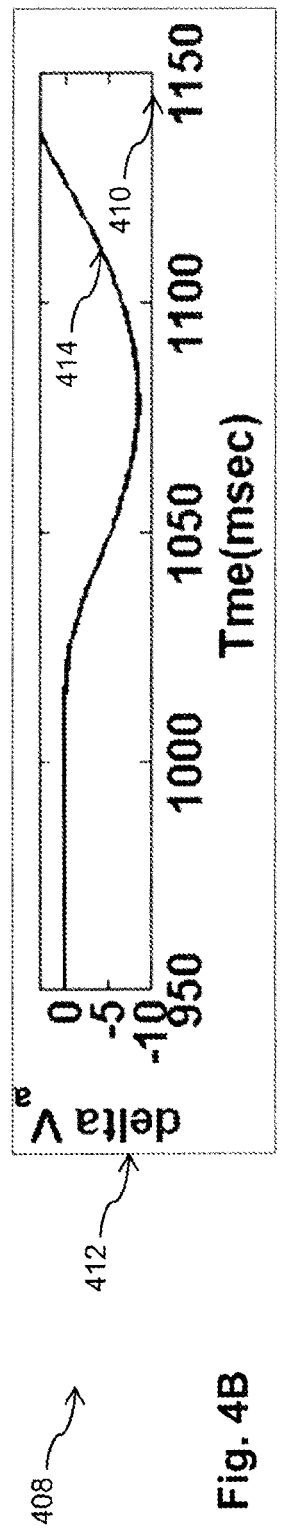
Figure 4C:
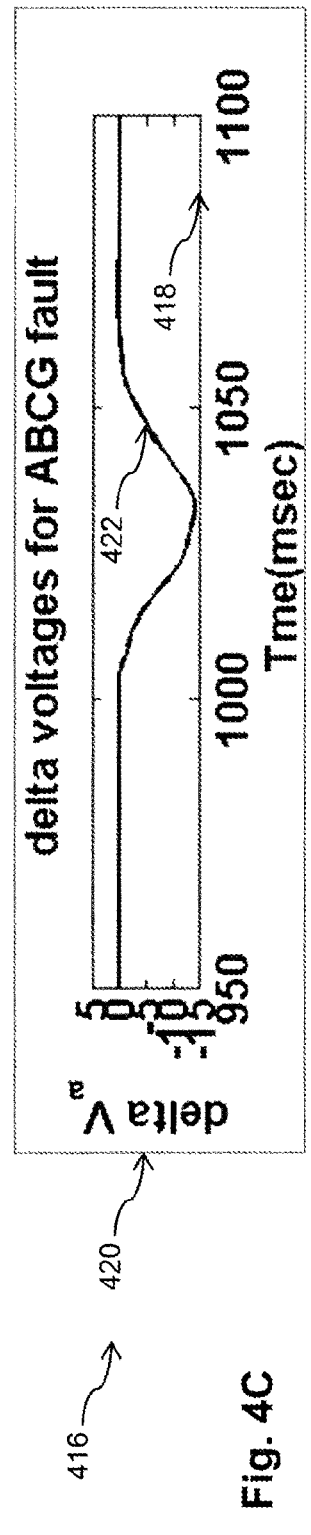

FIGS. 4A-4C are graphs 400, 408, 416 illustrating three voltage signals used in some embodiments of the present specification. The three voltage signals correspond to corresponding to a load change condition, a power swing condition and a power fault condition respectively. The graphs 400, 408, 416 correspond to a signal in the same phase of the power transmission line. FIG. 4A is a graph 400 illustrating a voltage signal variation during a load change condition in a three phase transmission line. The graph 400 includes an x-axis 402 representative of time in seconds and a y-axis 404 representative of change of voltage due to disturbance condition. The graph 400 includes a curve 406 representative of voltage changes during a load change disturbance condition. FIG. 4B is a graph 408 illustrating a voltage signal variation during a power swing condition in the three phase transmission line. The graph 408 includes an x-axis 410 representative of time in seconds and a y-axis 412 representative of change of voltage due to disturbance condition. The graph 408 includes a curve 414 representative of voltage changes during a power swing disturbance condition. FIG. 4C is a graph 416 illustrating a voltage signal variation in a fault condition in the three phase transmission line. The graph 416 includes an x-axis 418 representative of time in seconds and a y-axis 420 representative of change of voltage due to disturbance condition. The graph 416 includes a curve 422 representative of voltage changes during a three phase fault disturbance condition. It may be noted herein that curves 406, 414 and 422 have similar pattern and are not amenable for classification using threshold based techniques or by setting based methods. However, the rate of change of phase voltages of 422 corresponding to the three phase fault is higher compared to rate of change of voltages corresponding to power swing and load change cases. This property is being used in different embodiments of the present disclosure to determine disturbance condition as explained in detail with reference to subsequent figures.

Figure 5A:
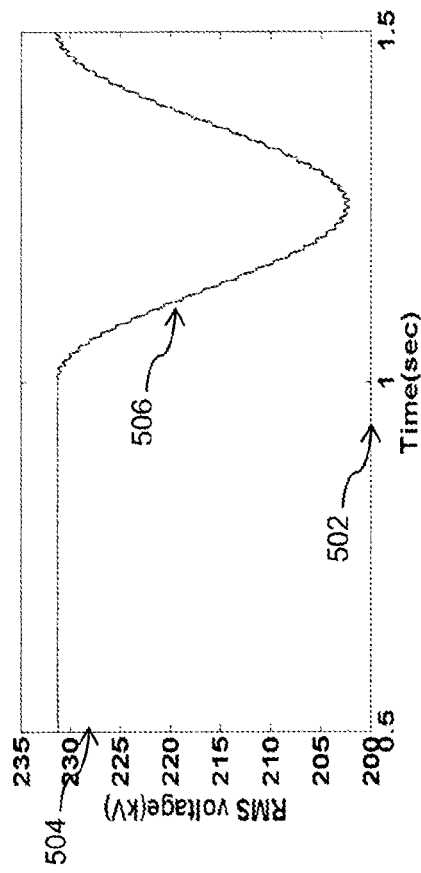
FIG. 5A is a graph illustrating a root mean square signal of a phase voltage determined in accordance with an exemplary embodiment.

FIG. 5A is a graph 500 illustrating a root mean square (RMS) signal of a phase voltage determined in accordance with an exemplary embodiment. The graph 500 includes an x-axis 502 representative of time in seconds and a y-axis 504 representative of root mean square (RMS) values expressed in kilo volts (kV). The graph 500 further includes a curve 506 representative of RMS voltage signal corresponding to one of the three phase voltage signals. It may be observed that the curve 506 exhibits variations in short intervals and may not be suitable for determining difference values required for detection of disturbance condition.

Figure 5B:
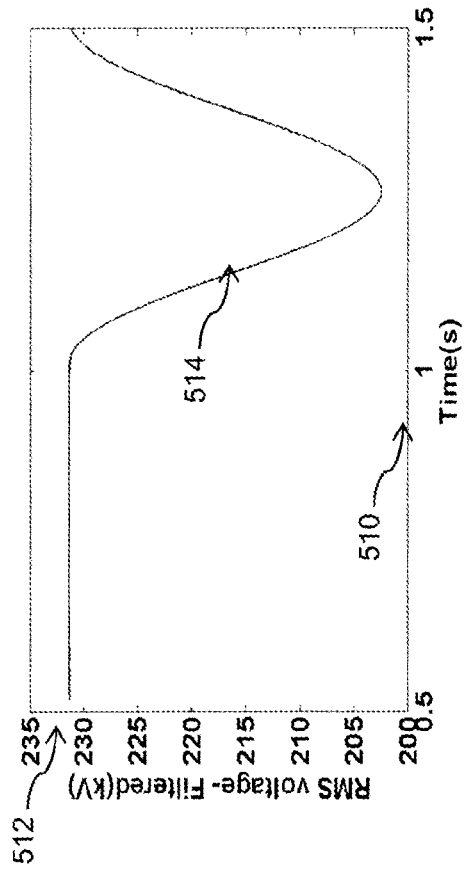
FIG. 5B is a graph illustrating smoothed version of curve of FIG. 5A in accordance with an exemplary embodiment.

FIG. 5B is a graph 508 illustrating smoothed version of curve of FIG. 4A in accordance with an exemplary embodiment. The graph 408 includes an x-axis 510 representative of time in seconds and a y-axis 512 representative of root mean square (RMS) values expressed in kilo volts (kV). The graph 408 further includes a smoothed version of the curve 506 of FIG. 5A determined in accordance with embodiments of the present specification. The curve 514 is representative of a filtered version of the RMS voltage signal corresponding to one of the three phase voltage signals. It may be observed that the curve 514 exhibits smooth variations and is more suitable for determining difference values required for detection of disturbance condition.

Figure 6:
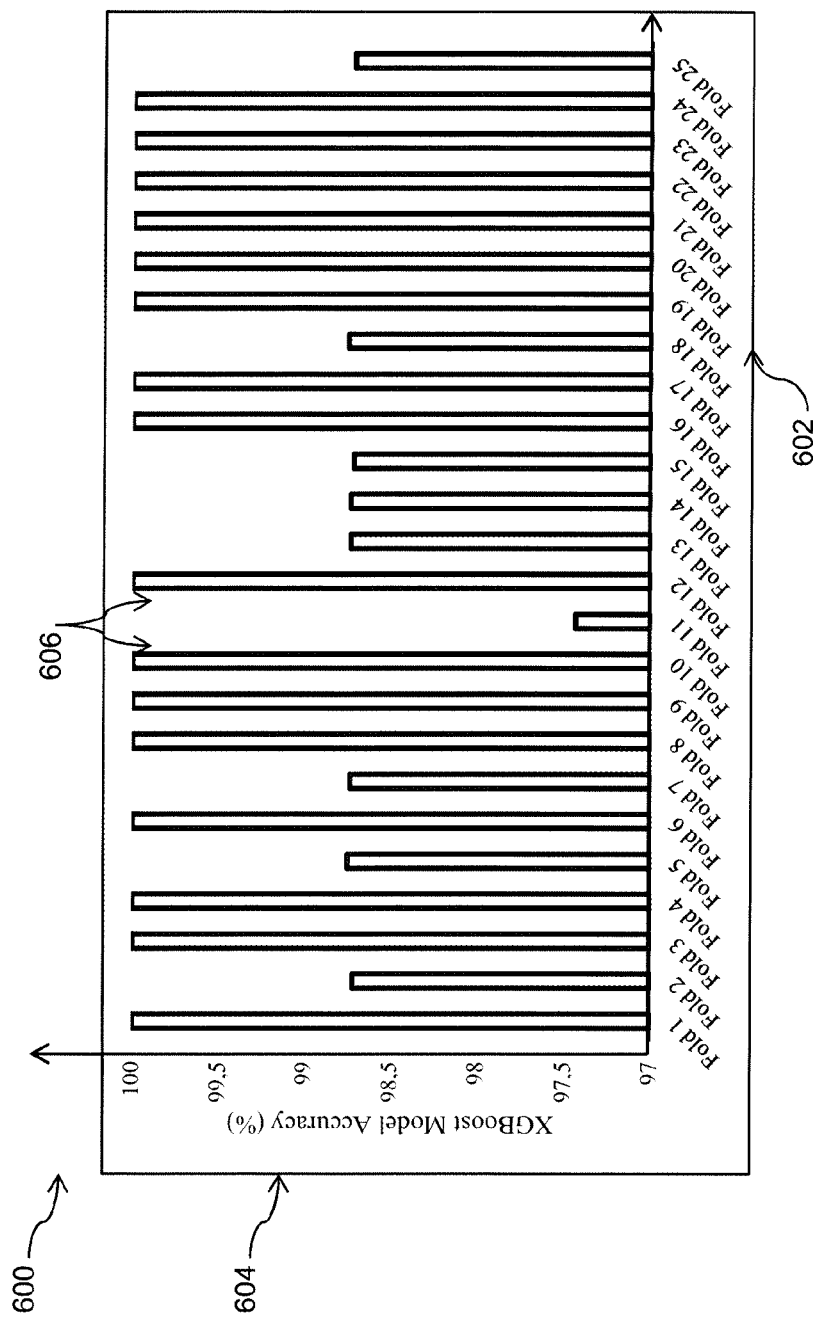
FIG. 6 is a graph illustrating accuracy of proposed machine learning technique for twenty five fold cross validation in accordance with an exemplary embodiment.

FIG. 6 is a graph 600 illustrating accuracy of proposed machine learning model in accordance with an exemplary embodiment. The graph 600 includes an x-axis 602 representative of index of cross validation and a y-axis 604 model accuracy of extreme gradient boost model in percentage values. The graph 600 also includes a plurality of columns 606 one for each cross validation test. The graph 600 includes results from of the twenty-five cross validation tests. The columns 606 are representative of model accuracy value for corresponding validation test. It may be observed that the model accuracy values vary between 97.5% to 100% confirming satisfactory performance during disturbance detection in power transmission line.

Figure 7:
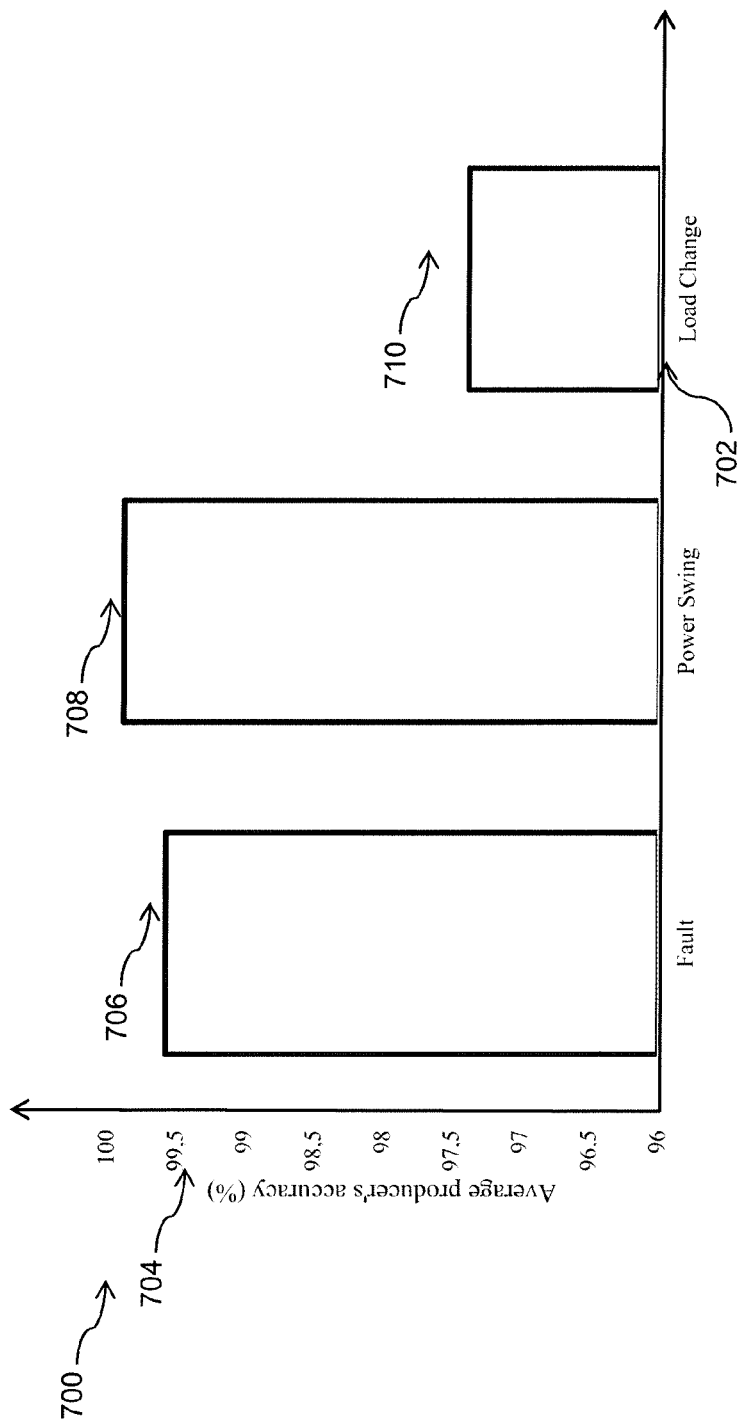
FIG. 7 is a graph illustrating producer's accuracy of the proposed machine learning technique in accordance with an exemplary embodiment.

FIG. 7 is a graph 700 illustrating Producer's accuracy corresponding to the proposed machine learning technique in accordance with embodiments of the present specification. The term "Producer's accuracy" used herein refers to an efficiency term defined based on errors of omission. In one embodiment, the Producer's efficiency is computed by omitting misclassification from the correct category and is indicative of how well each category is classified. The graph 700 includes an x-axis 702 representative of disturbance condition categories and a y-axis 704 representative of average Producer's accuracy in percentage values. The graph 700 also includes three columns 706, 708, 710 representative of Producer's accuracy for a fault condition, a power swing condition and load change condition respectively. The column heights are representative of average of Producer's accuracy values obtained from multiple cross validation tests for corresponding disturbance condition. It may be observed that the efficiency of disturbance conditions is above 97% which may be considered satisfactory for disturbance detection in power transmission line.

Figure 8:
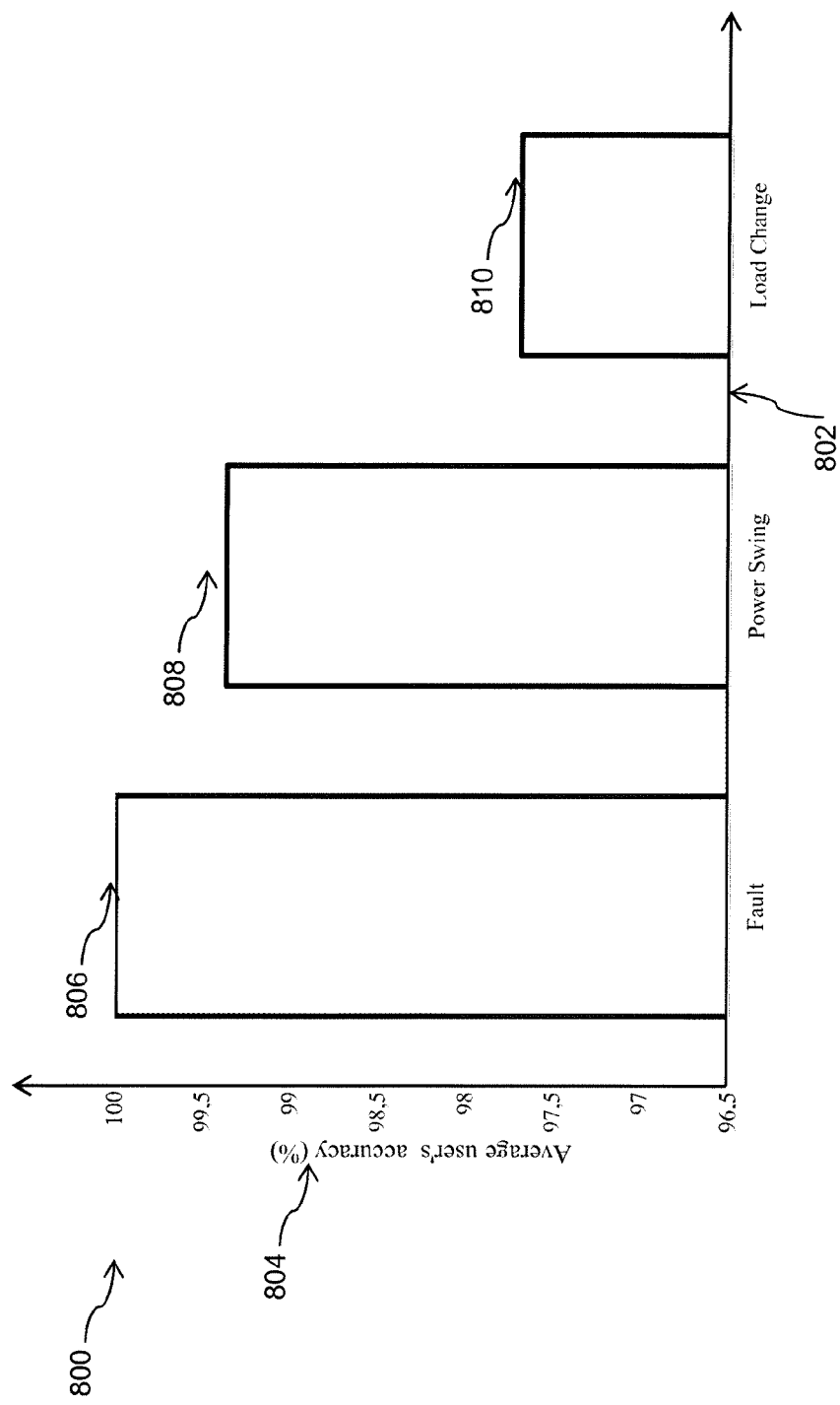
FIG. 8 is a graph illustrating user's accuracy of the proposed machine learning technique in accordance with an exemplary embodiment.

FIG. 8 is a graph 800 illustrating User's accuracy of the proposed machine learning technique in accordance with an exemplary embodiment. The term "User's accuracy" used herein refers to an efficient term computed based on errors of commission. Specifically, the User's accuracy is computed as the correct classification relative to a total number of predicted classifications of a category. User's efficiency is indicative of the probability that a sample from the classified category belongs to the actual category. The graph 800 includes an x-axis 802 representative of disturbance category. The graph 800 also includes a y-axis 804 representative of average User's accuracy. The average values of User's accuracy are obtained by averaging User's accuracy obtained from multiple cross validation tests. The graph 800 includes three columns 806, 808, 810 representative of average User's accuracy corresponding to three disturbance categories viz a fault condition, a power swing condition and a load change condition respectively. It may be observed that the values of average User's accuracy are more than 97.5% for all the disturbance conditions. It may also be observed that the proposed method is able to classify power system disturbance accurately and can be used to block or unblock the distance relay during power swing.

Figure 9:
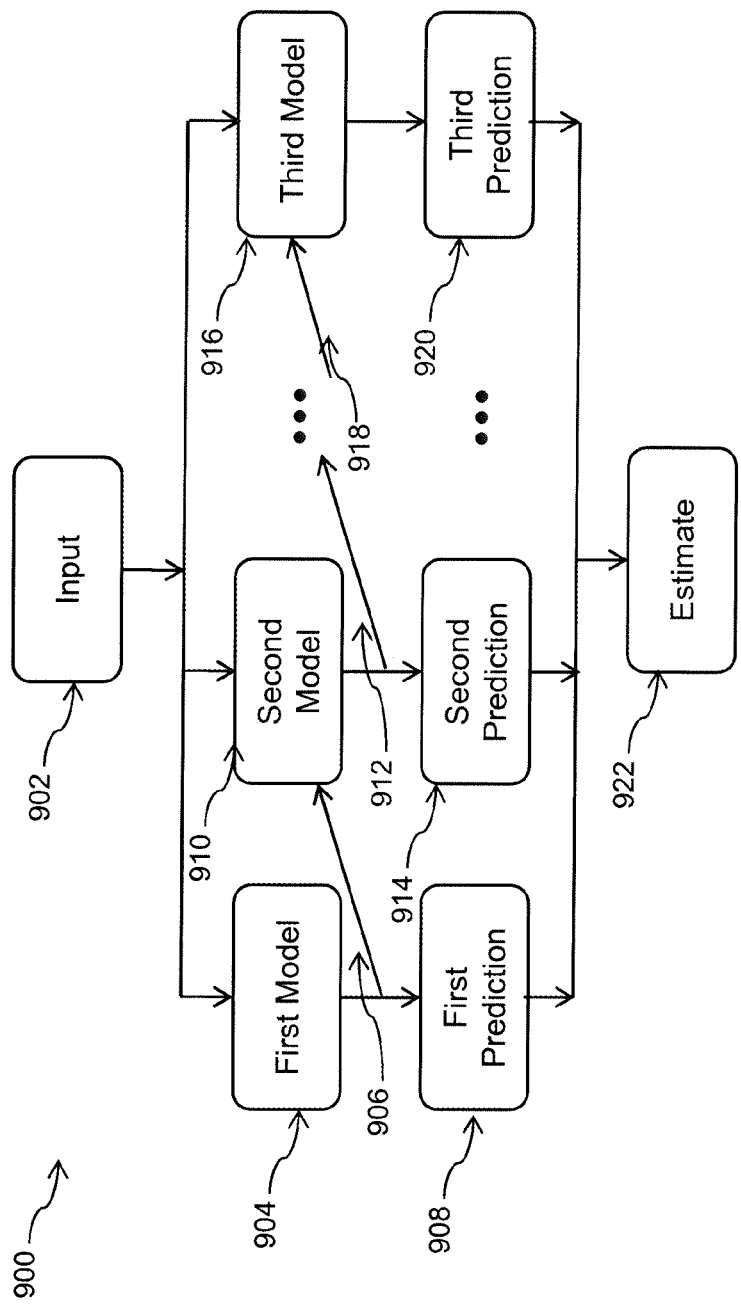
FIG. 9 is a schematic illustrating gradient boost classification technique in accordance with an exemplary embodiment.

As disclosed herein above, models based on one or more machine learning techniques can be utilized. The following describes one of the models in accordance with one of the embodiments. FIG. 9 illustrates gradient boost classification model 900 in accordance with an exemplary embodiment. The model 900 illustrates a data set 902 which is provided as input to the gradient boost classification technique. During the training phase, the data set 902 is a labeled training set and during the deployment phase, the data set 902 is a real time dataset obtained from the power transmission line.

The model 900 includes a plurality of models 904, 910, 916 determined sequentially using the data set 902 as input data. During the training phase, the dataset 902 is used to determine a first model 904 and a corresponding first prediction output 908. A first residual 906 is determined based on the first prediction and the ground truth output.

In the next step, the data set 902 is used with the first residual 906 as ground truth to determine a second model 910 and a corresponding second residual 914. A second residual 912 is determined based on the second prediction and the first residual 906. Similarly, subsequent models among the plurality of models are determined along with their corresponding predictions and residuals. In the illustrated embodiment, a third model 916 is determined as a final model and a corresponding third prediction 920 is determined as a final prediction. Further, an estimate 922 of the dataset 902 is determined based on the plurality of predictions 908, 914, . . . 920. In one embodiment, the final prediction 922 is determined by combining the plurality of predictions obtained from the plurality of models. During the deployment phase, the plurality of models 904, 910, . . . 916 determined during the training phase are used to process the data set 902 to determine the plurality of predictions 908, 914, . . . 920. In this embodiment, the data set 902 is representative of real-time measurement data from the transmission line. The final prediction 922 representative of disturbance condition determined based on the plurality of predictions 908, 914, 920.

In one example, a total of five thousand eight hundred ninety eight samples covering one thousand nine hundred sixty six disturbance conditions are used to train the model 900. The disturbance conditions are simulated using PSCAD/EMTDC software. The disturbance conditions include eight hundred sixteen power swing conditions, nine hundred fifty faults and two hundred load change conditions. The disturbance conditions for training cover a maximum possible combination of power system disturbance in terms of three-phase fault (fault location, fault resistance, inception angle, and swing frequency), power swing variations and load changes. A cross-validation technique is used to identify the best tuning parameters for extreme gradient boost classification model.

Embodiments disclosed in the present specification enable faster setting free disturbance detection, disturbance classification and taking operative action such as power swing blocking and unblocking methods for modern power systems. Such a feature may be enabled both for three-phase and two-phase systems and is a desirable for any advanced IEDs (e.g. numerical protection relays). Disclosed technique of disturbance detection requires measurement of only electrical parameter at one end (single ended method) with a low sampling frequency and can also be implemented in available numerical/digital relays. The proposed method can work with only voltage signals. In such a case, there is no need for current signals and issues with saturation of current transformer is completely avoided.

The invention claimed is:

1. A method for determining a disturbance condition in a power transmission line, wherein the method is performed by an Intelligent Electronic Device (IED) communicatively coupled with a measurement equipment connected with the power transmission line, the method comprising:
   obtaining a plurality of sample values corresponding to an electrical parameter measured in each phase among one or more phases, wherein the electrical parameter in the one or more phases is measured with the measurement equipment connected at one end of the power transmission line;
   determining a plurality of magnitudes of the electrical parameter corresponding to each phase based on the corresponding plurality of sample values;
   determining a plurality of difference values for each phase based on the corresponding plurality of magnitudes, wherein each of the plurality of difference values is representative of a rate of change of magnitudes for the corresponding phase, wherein determining the plurality of difference values comprises
      detecting the disturbance condition based on comparing each of the plurality of difference values with a pre-determined threshold value, and
      selecting a subset of the plurality of difference values subsequent to the detection of the disturbance condition;
   processing only the selected subset of the plurality of difference values corresponding to the one or more phases using a machine learning technique to determine a type of the disturbance condition in the power transmission line, wherein the disturbance condition is one of a load change condition, a power swing condition, or an electrical fault condition; and
   performing at least one of a protection function or a control function based on the disturbance condition.

2. The method of claim 1, wherein the plurality of sample values corresponds to a plurality of voltage samples obtained from sampling a voltage signal.

3. The method of claim 1, wherein determining the plurality of difference values comprises performing a smoothing operation on the plurality of magnitudes corresponding to each phase among the one or more phases by filtering the corresponding magnitudes.

4. The method of claim 3, wherein the plurality of difference values is determined by computing difference between successive samples of the smoothed version of the plurality of magnitudes.

5. The method of claim 1, wherein the one or more phases correspond to phases of a three-phase electrical system.

6. The method of claim 1, wherein the plurality of sample values is obtained by sampling in the corresponding phase with one kilohertz sampling rate.

7. The method of claim 1, wherein each of the plurality of difference values is a difference between two successive ones of the magnitudes.

8. The method of claim 1, wherein the disturbance condition is the power swing condition.

9. The method of claim 1, wherein the machine learning technique is based on an ensemble machine learning technique, wherein the ensemble machine learning technique comprises an extreme gradient boost classification model trained for determining the disturbance condition.

10. The method of claim 9, wherein performing at least one of a protection function or a control function based on the disturbance condition comprises a blocking operation of a switching device using the IED during a self-restoring power swing condition or an unblocking operation of the switching device during fault conditions.

11. The method of claim 10, wherein the extreme gradient boost classification model comprises a plurality of residual models.

12. An Intelligent Electronic Device (IED) for determining a disturbance condition in a power transmission line, the IED comprising:
a data acquisition unit communicatively coupled to a measurement equipment connected at one end of a power transmission line and configured to obtain a plurality of sample values corresponding to an electrical parameter measured in each phase among one or more phases, wherein the measurements are performed by the measurement equipment;
a signal processing unit communicatively coupled to the data acquisition unit and configured to:
determine a plurality of magnitudes of the electrical parameter corresponding to each phase among the one or more phases based on the corresponding plurality of sample values, and
determine a plurality of difference values for each phase among the one or more phases based on the corresponding plurality of magnitudes, wherein each of the plurality of difference values is representative of rate of change of magnitudes for the corresponding phase, wherein determining the plurality of difference values comprises
detecting the disturbance condition based on comparing each of the plurality of difference values with a pre-determined threshold value, and
selecting a subset of the plurality of difference values subsequent to the detection of the disturbance condition;
a machine learning unit communicatively coupled to the signal processing unit and configured to process only the selected subset of the plurality of difference values corresponding to one or more phases using a machine learning technique to determine a type of disturbance condition in the power transmission line, wherein the disturbance condition comprises one of a load change condition, a power swing condition, or a transmission line fault condition; and
a control unit communicatively coupled to the machine learning unit and configured to perform at least one of a protection function or a control function based on the disturbance condition.

13. The IED of claim 12, wherein the plurality of sample values corresponds to a plurality of voltage samples obtained from a voltage signal.

14. The IED of claim 12, wherein the signal processing unit is further configured to generate a smoothed version of the plurality of magnitudes corresponding to each of the plurality of phase voltage signals by filtering the corresponding magnitudes.

15. The IED of claim 14, wherein the signal processing unit is configured to determine the plurality of difference values based on the smoothed version of the plurality of magnitudes.

16. The IED of claim 12, wherein the data acquisition unit is configured to obtain the plurality of samples from one or more phases of a three-phase electrical system.

17. The IED of claim 12, wherein the data acquisition unit is configured to sample the electrical parameter in each phase among the one or more phases with one kilohertz sampling rate.

18. The IED of claim 12, wherein each of the plurality of difference values is a difference between two successive ones of the magnitudes.

19. The IED of claim 12, wherein the disturbance condition is the power swing condition.

20. The IED of claim 12, wherein:
the machine learning unit is further configured to train an ensemble machine learning model for determining the disturbance condition; and
the control unit is further configured to train an extreme gradient boost classification model for determining the disturbance condition.

21. The IED of claim 20, wherein the control unit is configured to block operation of a switching device using the IED during a self-restoring power swing condition or unblock operation of the switching device during fault conditions.

22. The IED of claim 21, wherein the machine learning unit is configured to determine a plurality of residual models.

* * * * *